United States Patent
Onisawa et al.

[11] Patent Number: 5,831,694
[45] Date of Patent: Nov. 3, 1998

[54] TFT PANEL FOR HIGH RESOLUTION- AND LARGE SIZE- LIQUID CRYSTAL DISPLAY

[75] Inventors: Kenichi Onisawa, Hitachinaka; Toshiki Kaneko, Chiba; Kenichi Hashimoto, Hitachinaka; Tetsuroh Minemura, Hitachioota, all of Japan

[73] Assignee: Hitachi, Ltd., Tokyo, Japan

[21] Appl. No.: 663,523

[22] Filed: Jun. 13, 1996

[30] Foreign Application Priority Data

Jun. 14, 1995 [JP] Japan ................................ 7-147852
Jul. 10, 1995 [JP] Japan ................................ 7-173536

[51] Int. Cl.$^6$ ............................ G02F 1/136; G02F 1/1343
[52] U.S. Cl. .............................. 349/43; 349/46; 349/143; 349/147; 438/30
[58] Field of Search .................. 349/42, 43, 46, 349/143, 147; 438/30

[56] References Cited

U.S. PATENT DOCUMENTS

5,434,363  7/1995  Goto et al. ............................. 174/256
5,594,259  1/1997  Shimada et al. ......................... 257/66
5,598,011  1/1997  Oh ....................................... 257/57
5,600,461  2/1997  Ueda et al. ............................. 349/42

*Primary Examiner*—Anita Pellman Gross
*Attorney, Agent, or Firm*—Antonelli, Terry, Stout & Kraus, LLP

[57] ABSTRACT

A liquid crystal display unit in which at least one of a gate electrode line, a drain electrode line, and a gate electrode and a source/drain electrode of a TFT formed on a substrate is composed of a metal Nb or an alloy material of Nb. Glass is used as the substrate, and the size thereof is preferably 300 mm or longer on one side and 1 mm or less in thickness. In order to provide a low wiring resistance to produce a high resolution and large size TFT panel, the resistivity of the metal Nb or the alloy material thereof is preferably 25 $\mu\Omega$cm or less, and the film stress of Nb or the alloy material thereof on the glass substrate is 400 MPa or less.

8 Claims, 7 Drawing Sheets

TFT PANEL FOR HIGH RESOLUTION- AND LARGE SIZE- LIQUID CRYSTAL DISPLAY

BACKGROUND OF THE INVENTION

The present invention relates to a high resolution- and large size- active matrix type liquid crystal display (LCD) driven by thin film transistors (TFT), a method of manufacturing the same, and a liquid crystal display unit.

The needs for LCD devices as display units are increasing rapidly as information processing devices such as personal computers become smaller in size and lighter in weight and are used more widely. The requirements for improvement of performance such as larger display area, higher resolution, faster response and full color have become stronger, bringing cost reduction with the expansion of the LCD market.

This trend has brought about forming of a transparent insulating substrate such as glass into a thin plate, adoption of liquid crystal with higher dielectric constant, and adoption of a TFT driven active-matrix type LCD to make a display area larger in size because lighter weight and faster response are brought therewith. Further, full color and higher resolution require improvement of image quality, i.e., no defects and steepness of a driving pulse. Furthermore, in order to realize cost reduction, it is indispensable to aim at reduction of a manufacturing process cost of a TFT driven LCD panel utilizing amorphous silicon (a-Si), i.e., reduction of the number of process steps, improvement of throughput, improvement of yield and so forth.

When a high resolution- and large size- LCD panel is manufactured, a metal wiring, a transparent conductive film, an insulating film and a semiconductor film are formed repeatedly and patterning is applied thereto. Therefore, it is important to secure high reliability of address lines (gate electrode lines and drain electrode lines of TFTs) to which a plurality of pixels are connected, especially to meet the requirement for no defects. Namely, the requirements include selection of materials having high chemical stability, close adhesion to a substrate, adoption of a manufacturing method capable of uniform deposition, security of the insulation property at intersecting points of vertical and horizontal wirings and so on.

Ta has heretofore principally been used as the wiring material to meet these requirements since it is a material having high chemical durability and strong adherence with a glass substrate. It is also capable of forming an insulating film of high quality by surface oxidation. A thin film of Ta can be formed easily by physical vapor deposition such as sputtering. However, Ta has a problem that the resistance value of wirings made of Ta is increased when a surface oxide film is formed. Since the time constant becomes larger when the wiring resistance is high in a high resolution- and large size- LCD, a drive-pulse produces delay during transfer and waveform distortion becomes larger, thus deteriorating the display quality. As a technique for solving such a problem, an arrangement for attaining low resistance by using a Ta-Mo alloy as a gate line material is disclosed in Japanese Patent Publication No. HEI 5-84915 (No. 84915/1993), an arrangement of using a stacked layer of Ta/Nb as a gate electrode line is disclosed in Japanese Patent Laid-Open No. HEI 2-106723 (No. 106723/1990), and further, an arrangement of using a Ta-Nb alloy or a Nb or Nb major constituent alloy as a gate electrode line material is disclosed in Japanese Patent Laid-Open No. HEI 5-55575 (No. 55575/1993).

Figure 6:
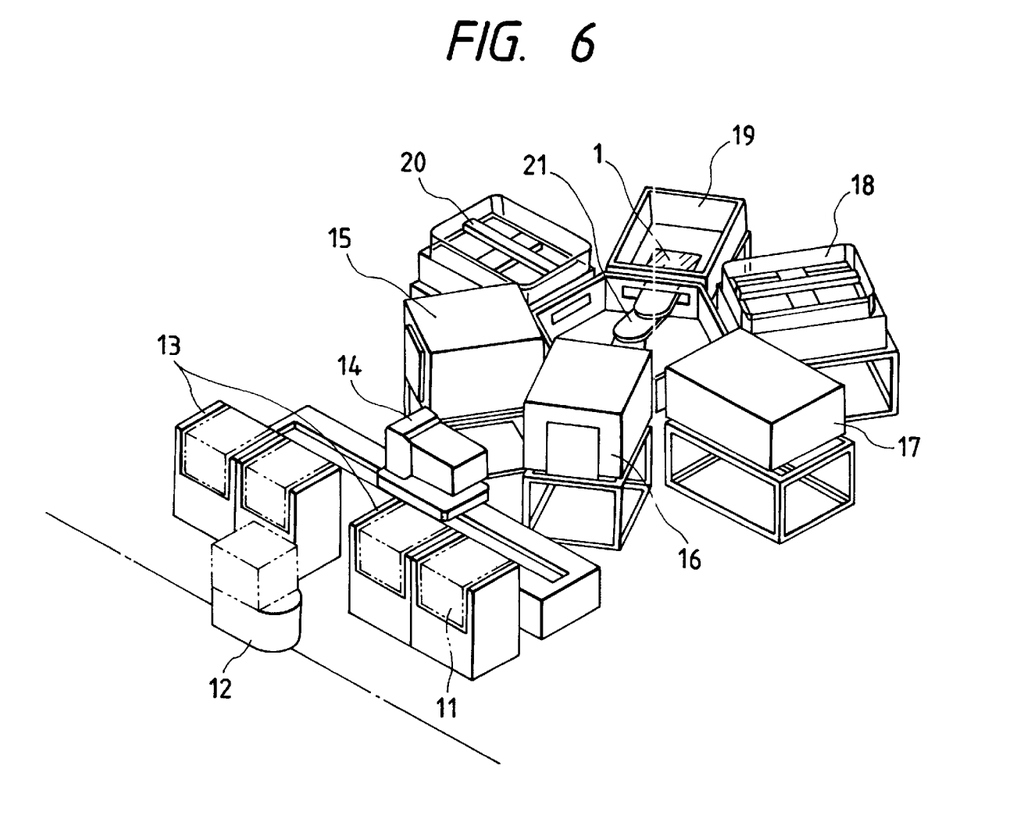
FIG. 6 is a diagram showing the outline of a cluster-type DC sputtering apparatus.

In order to lower the cost of a TFT panel for an LCD, an apparatus capable of depositing or performing dry etching processing of a gate or drain wiring layer and a semiconductor layer with large throughput and high yield is required. For this purpose, a cluster-type DC sputtering apparatus such as shown in FIG. 6, which is described later, has been developed as an apparatus capable of corresponding easily to forming of a large-sized substrate or also to unmanned processing. However, it has been found that foreign matters are often undesirably mixed into the gate or drain wiring layer, thereby causing a problem of disconnection or local high resistance when a gate or drain wiring layer is formed using this sputtering apparatus. Accordingly, the Ta-Mo alloy disclosed in Japanese Patent Publication No. HEI 5-84915 (No. 84915/19-93) and the Ta-Nb alloy and the Nb major constituent alloy disclosed in Japanese Patent Laid-Open No. HEI 5-55575 (No. 55575/1993) are not desirable when considered in light of the need for improvement of manufacturing yield.

Further, the Ta/Nb stacked layer disclosed in Japanese Patent Laid-Open No. HEI 2-106723 (No. 106723/1990) has an effect in terms of forming Ta in a stable α type structure with low resistance, but prevents attaining low cost in terms of the decrease in throughput and yield because of the stacked layer structure thereof. On the other hand, an arrangement of using Nb in gate electrode lines is also disclosed in Japanese Patent Laid-Open No. HEI 5-55575 (No. 55575/1993), but a metal material such as Mo, Ti and Cr is used for the source electrode lines or the drain electrode lines, and a problem arises that the process becomes complicated and the throughput is lowered.

SUMMARY OF THE INVENTION

It is an object of the present invention to provide a panel capable of contributing to attaining of low cost by increasing the throughput and the yield. It is a further object to provide a panel capable of contributing to high display quality by making address wiring resistance smaller in manufacturing a TFT panel for high resolution- and large size- LCD, as well as to provide a method of manufacturing the panel and a display unit utilizing the panel.

According to the present invention, a TFT panel for high resolution- and large size- LCD is disclosed in which at least one of the gate electrode line, the drain electrode line, the gate electrode and the source/drain electrode is formed of a metal Nb or an alloy material thereof in what is called an inverse stagger type TFT panel. In such an inverse stagger type TFT panel, gate electrode lines and drain electrode lines meeting at a right angle therewith are formed on a transparent insulating substrate, and a TFT is formed on a gate electrode. In particular, the present invention is suitable to be applied to a large-sized thin plate type transparent insulating substrate having a length of one side of 300 mm or longer and a thickness of 1 mm or less.

Furthermore, in accordance with one aspect of the present invention, a panel is provided having a high conductivity, low stress metal film in which the resistivity of each electrode line and each electrode formed of the metal Nb described above is 250 $\mu\Omega$cm or less and the film stress given to the transparent insulating substrate by film production is 400 MPa or less.

Further, it is disclosed in the present invention that it is desirable to form an address wiring so that it has a taper within 60° from the surface of the transparent insulating substrate at the edge portion of the address wiring.

The TFT panel described above may be achieved by forming a Nb film by a DC magnetron sputtering method under the conditions that the residual gas pressure is $1\times10^{-6}$ Torr or lower, the introducing gas pressure is 2 to $5\times10^{-3}$ Torr and the power density of 5 W/cm² or higher.

It is more desirable that the DC magnetron sputtering onto the Nb transparent insulating substrate is performed with a cluster-type sputtering apparatus in which the substrate temperature is set to 90° C. or higher.

When inert gas in extremely small quantities is introduced into a high vacuum chamber having a low residual gas pressure and DC magnetron sputtering is applied to the metal Nb so as to deposit it on the transparent insulating substrate, a metal film of low distortion which has good electrical contact with a-Si and the transparent electrode ITO and high conductivity at the resistivity of 25 $\mu\Omega$cm or lower with a film stress of 400 MPa or lower is obtainable. Since all of the address wirings and the TFT electrodes are formed of the same material (Nb), film formation and the etching process are performed under the same process conditions, thus increasing the throughput and moreover reducing the material cost. Further, since the film of low distortion is formed under appropriate film forming conditions using a cluster-type DC magnetron apparatus filled with a plurality of substrates, the warp of the transparent insulating substrate becomes very small, and high speed handling with a robot arm has become sufficiently possible even when a large-sized thin type substrate having a length on one side of 300 mm or longer and a thickness of 1 mm or less is used. It is a matter of course that accidents such as peeling of the film and cracking of the substrate can be prevented by the lowering of distortion described above, which leads to improvement of the yield.

When a taper area at 60° or less has been formed at the end portion of the gate or drain wiring, coverage of a transparent pixel electrode which is deposited thereon is improved. Thus, it is possible to reduce point defect density, which leads to the improvement of the display quality.

Further, according to an aspect of the present invention, at least one of each electrode and wiring thereof of the thin film transistor described above is structured of an alloy material containing Nb as the major constituent with at least one of Mo or V added thereto.

Alternatives for forming these wirings are as follows:

structuring the wirings of the same alloy material;

forming the wiring with the same film thickness;

forming the wirings as a stacked film of an alloy layer in which the density of at least one metal of Mo or V is high and an alloy layer in which the density of the same is low; and forming the wirings as stacked film of a Nb layer and an alloy layer containing Nb as the major constituent with at least one metal of Mo or V added thereto.

First, by adding Mo (or V) to Nb, the film stress is reduced, and the thermal expansion coefficient of the whole film is also brought closer to the thermal expansion coefficient of the glass that becomes the substrate.

Further, since it is possible to increase the thickness of the wiring film as a result of the foregoing, it becomes possible to achieve low resistance.

Next, Mo (or V) is a less expensive material as compared with Nb. Thus, a target used for sputtering becomes less expensive than the case of the Nb target by alloying according to the present invention.

Further, the yield in the manufacturing process is improved by adding Mo (or V) to Nb.

Namely, a refractory metal target used in sputtering is generally produced by sintering of raw material powder. As a result, particles are generated from the target during sputtering, and the yield is lowered by such particles adhering to the substrate. In the case of an alloy target in particular, a second phase or a deposit is liable to exist in the target, which has been liable to cause generation of particles.

In the case of a Nb-Mo alloy, however, it becomes possible to control generation of a second phase or a deposit because of such reasons that this alloy forms an isomorphous system, in which a complete solid solution is observed for all ratios of components. Further, it is possible to melt the material by electron beam radiation because the melting point is lower than the case of a Nb single body by virtue of the alloying. Thus, the problem of particle generation is avoided, thereby making it possible to improve the yield.

Next, according to another aspect of the present invention, the gate wiring and the drain wiring are made of the same material and formed in the same film thickness.

As a result, the requirements are satisfied that the time until a film is produced after the substrate is set to the manufacturing apparatus or the time until the substrate is carried out of the apparatus after etching is completed is short (the throughput is large), the time required during the steps is constant (physical distribution does not stagnate), materials used in the processes such as film formation and etching are inexpensive, and material types are small in number. Hence, it is possible to reduce manufacturing cost sufficiently.

Furthermore, according to still another aspect of the present invention, a taper at 60° or less is formed at the pattern edge portion of the wiring, thus making it possible to obtain satisfactory coverage of a pixel electrode thereon. Therefore, generation of defects is suppressed, and reduction of the manufacturing cost can be also achieved in this regard.

Further, it is possible to consider a counterplan for providing such a taper by devising the etching method by selecting the etchant appropriately and so on. According to the present invention, however, since at least one type of metal containing Nb as the major constituent and selected from Mo or V is used for the wiring material and the wiring is structured of a stacked film consisting of an alloy layer having high concentration and an alloy layer having low concentration, it is possible to consider a counterplan only with such an arrangement.

Namely, since a fact that the etching rate is increased as the addition quantity of Mo or V to Nb is increased can be utilized, it is possible to simplify the end face structure in a taper form by placing an alloy layer containing a small amount of addition quantity of Mo or V at a lower layer and an alloy layer containing a large amount of addition quantity of Mo or V at an upper layer, and moreover, to realize the structure securely.

Further, it is also possible to form a good end face configuration with a stacked film consisting of a Nb layer or an alloy layer containing Nb as the major constituent with at least one metal of Mo or V added thereto on a similar principle.

BRIEF DESCRIPTION OF THE DRAWINGS

These and other objects, features and advantages of the present invention will be understood more clearly from the following detailed description with reference to the accompanying drawings, wherein.

DESCRIPTION OF THE PREFERRED EMBODIMENTS

First, various types of metal films are deposited on a glass substrate in order to select a metal material that can form all of a gate electrode line, a drain electrode line, a gate electrode and a source/drain electrode using a DC magnetron apparatus which is simple in handling and which has good reproducibility and in which high throughput can be expected, and the states thereof have been investigated. Taking electrical contactability with a-Si and the material cost into consideration, Al, Cu, Cr, Nb, Mo, W and their alloys have been tested.

As a result, it has been found that Al, Mo and W are insufficient in terms of their chemical resistance for a film made of these materials, and Cu has very poor adhesion with a glass substrate. Therefore, they are not suitable for the electrode and wiring material. Furthermore, it was also found that a hillock is generated for Al in the heating process after film formation. Since it is required to heat the substrate in the CVD process used when a gate insulating film and a semiconductor film are formed, it may safely be said that Al is not suitable for use. On the other hand, it has been also found that it is difficult for these alloys to be made uniform in addition to high manufacturing cost when they are molded into a sputtering target, and that foreign particles are generated and lowering of the yield is caused sometimes when a film is formed by sputtering.

As a result of the above-described experiments, the inventors tentatively selected the metal of Cr and Nb for their adaptability as the sputtering targets. Thus, a residual film stress after film formation has been examined with respect to these two types of metals to determine their respective advantages.

Figure 5:
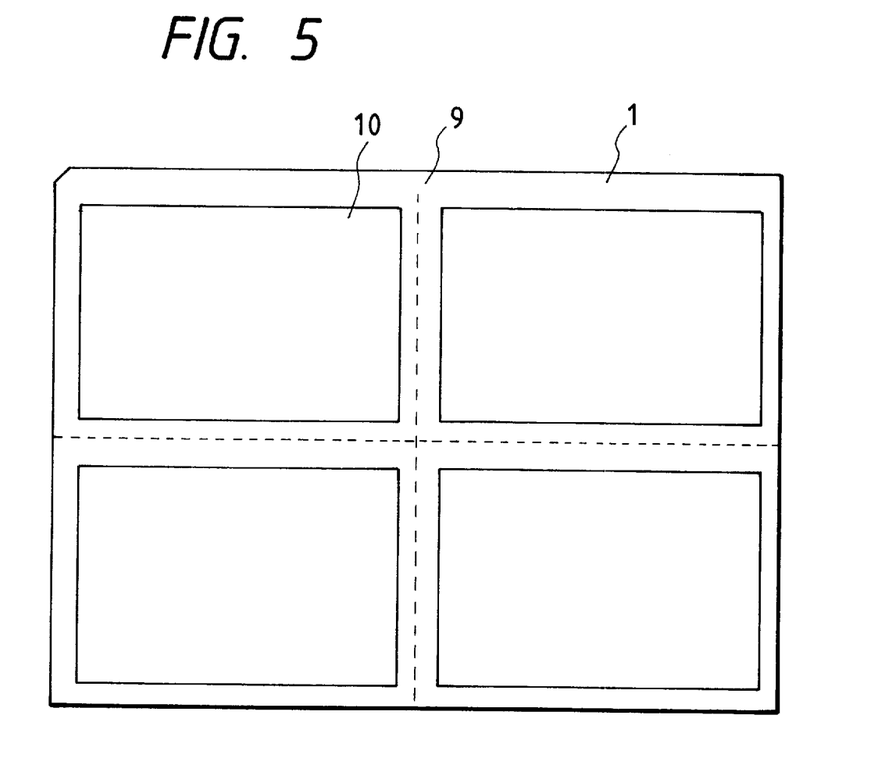
FIG. 5 is a plan view showing a glass substrate for a TFT panel having a size of 370×470 mm$^2$.

Taking mass production into consideration, a large-sized thin glass plate (370×470 mm$^2$ in size, and 0.7 mm in thickness) was introduced into a cluster-type DC sputtering apparatus to form a transparent insulating substrate, a Cr or Nb film was deposited thereon, and a gate wiring was formed thereafter by patterning. Four sheets of 10 inch TFT panels can be manufactured as shown in FIG. 5 from the large-sized glass substrate 1 described above. A panel having a diagonal size of 10 inches shown at a scope 10 is obtainable by cutting the glass substrate 1 along a break line 9 in an LCD filling process after the manufacturing process of the TFT.

The film forming process with the cluster-type DC sputtering apparatus the structural outline of which was shown in FIG. 6 is as follows. A cassette 11, in which a plurality of glass substrates 1 that are dried after sufficient cleaning are contained, is carried by an automated transport robot 12 and installed on a moving stage 13. A moving robot 14 houses the cassette 11 in a first load/unload chamber 15 or in a second load/unload chamber 16. After each cluster-type chamber of the sputtering apparatus is evacuated, the glass substrate 1 is transferred to a heating chamber 17 one by one by means of a vacuum transport robot 21. The glass substrate 1 is carried to a first deposition chamber 18 by the robot 21 after the temperature rises to a predetermined temperature and a film is deposited thereon by sputtering. The next glass substrate 1 is carried to a second deposition chamber 19 and applied with sputtering after the temperature rise to a predetermined temperature in the heating chamber 17 during this period. Furthermore, a film is also deposited through a similar process in a third deposition chamber 20. When film deposition is completed, the glass substrate 1 is returned to the first load/unload chamber 15 or the second load/unload chamber 16 by means of the robot 21. Air leakage is subsequently permitted, the glass substrate 1 is returned to the cassette 11 on the transport stage 13 one sheet at a time by means of the transport robot 14, and the cassette 11 is moved to a next process apparatus by means of the automated transport robot 12.

The Cr or Nb film deposited in the process described above was exposed and developed in a normal photolithography process and applied with patterning into the address wiring. Thereafter, electrical characteristics of the Cr film and the Nb film and adherence states of these films were investigated.

As a result, it has been confirmed that both Cr and Nb can be formed into a low resistance film having the resistivity of 25 $\mu\Omega$cm or less, but very large residual film stress has been observed in the case of Cr. Namely, even when film forming conditions are changed in various ways, tensile stress of 1,000 to 1,200 MPa is generated in the Cr film. Thus, the glass substrate 1 is distorted, which interferes with handling with a robot arm. In the glass substrate 1 having large warpage, some problems which occur are that cracks are generated thereby lowering of the yield, and suspension of operation of an apparatus or accuracy of patterning is lowered in the photolithography process. In contrast to the above, it has been understood that a film can be deposited without producing warpage of the glass substrate 1 practically by optimizing film forming conditions in the case of Nb.

In the address wiring of a TFT panel for an LCD, a wiring resistance value that exerts an influence on a waveform distortion of a drive-pulse is given with a sheet resistance value of the film. Metal film thickness $d_{0.7}$ (nm), which gives sheet resistance of 0.7 $\Omega/\square$, calculated with respect to respective cases that resistivity is 20, 25 and 30 $\mu\Omega$cm is shown in Table 1.

TABLE 1

Relationship between Metal Film and Sheet Resistance Value

| Resistance ($\mu\Omega$cm) | Film thickness (nm) | Sheet resistance ($\Omega/\square$) | $d_{0.7}$ (nm) |
|---|---|---|---|
| | 200 | 1.00 | |
| 20 | 300 | 0.67 | 286 |
| | 400 | 0.50 | |
| | 200 | 1.25 | |
| 25 | 300 | 0.83 | 357 |
| | 400 | 0.63 | |
| | 200 | 1.50 | |
| 30 | 300 | 1.00 | 429 |
| | 400 | 0.75 | |

Table 1 shows the relationship that the sheet resistance value falls when the film thickness is increased, and $d_{0.7}$ corresponding to respective resistivity values have been obtained therein. Since bending is generally increased when the film thickness is increased, however, warpage of the glass substrate is also increased. The expression showing the relationship between deflection $\delta$ of a one-side clamped beam and film stress $\sigma$ is given as follows.

$$\delta = \frac{3 \cdot (1 - \nu)}{E} \cdot \frac{l^2}{b^2} \cdot d \cdot \sigma$$

Figure 7:
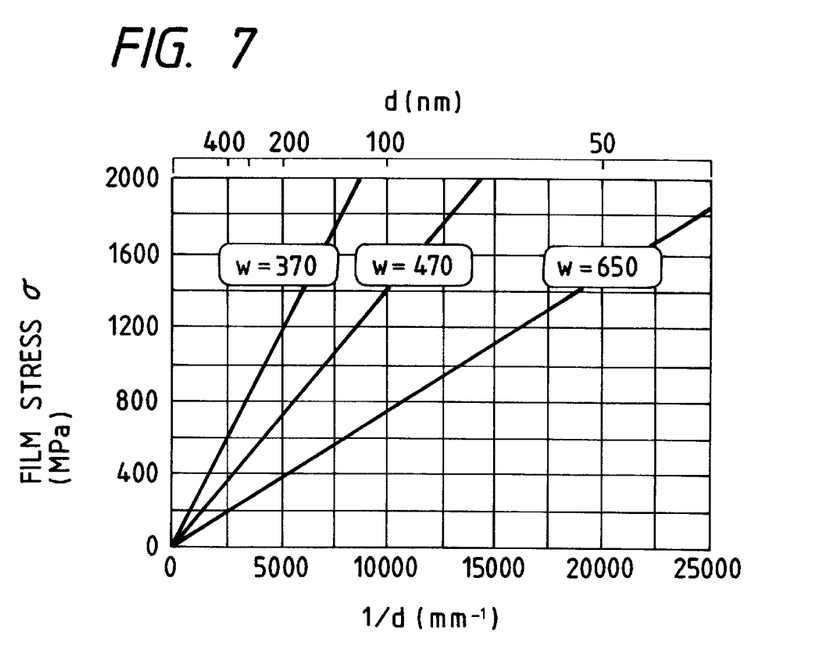
FIG. 7 is a diagram showing the relationship between the deposited film stress giving a warp of 2 mm to a glass substrate having a thickness of 0.7 mm and the film thickness.

Here, E represents Young's modulus of a substrate, $\nu$ represents Poisson's ratio of the substrate, l represents the length of the substrate, b represents the thickness of the substrate and d represents the film thickness. Due to a fact that the deflection of the substrate at which troubles in conveyance and exposure/development process start to increase is approximately 2 mm according to actual measurement, the relationship between the film stress $\sigma$ and the film thickness d (an inverse number thereof) which give the substrate deflection 2 mm was obtained with the substrate size (substrate width W) as the parameter. These results are shown in FIG. 7. The substrate thickness was set to 0.7 mm.

The following facts are seen from FIG. 7. Namely, when it is assumed that the glass substrate size is set to 370×470 mm², the film thickness which produces the deflection of the substrate at approximately 2 mm corresponding to residual film stress (approximately 1,200 MPa) becomes 120 to 200 nm in the Cr film. According to the relationship between the film thickness and the sheet resistance value, partial results of computation of which are shown in Table 1, even if the resistivity of Cr is 20 $\mu\Omega$cm, the sheet resistance in this case exceeds 1.0 $\Omega/\square$. Hence, electrical characteristics that guarantee the display quality are not satisfied. Further, it is understood, in a film thickness of 357 nm which gives the sheet resistance of 0.7 $\Omega/\square$ in the case of the resistivity 25 $\mu\Omega$cm obtained from Table 1, it is required to set the film stress to approximately 400 MPa or less in 470 mm size and the film stress to 200 MPa or less in 650 mm size in order to control bending of the substrate to 2 mm or less.

Besides, the reason why 0.7 $\Omega/\square$ has been selected here as the sheet resistance value is that this is the gate wiring resistance required for realizing a TFT-LCD for a display diagonal size of up to approximately 14 inches. In other words, when sheet resistance at this value or less is set, it is possible to design a TFT-LCD for a display diagonal size of up to approximately 14 inches having no inferior display image quality due to a dull waveform of the gate pulse.

Further, since it is possible to produce 6 sheets of 10-inch class panels (4 sheets of 12-inch class panels) by adopting a substrate of about 550×650 mm, the throughput can be improved further and the cost of the TFT-LCD is reduced further as compared with the size of 370×470 mm.

From the foregoing description, it may safely be said that Cr is unsuitable either electrically or mechanically as the material for the address wiring of a TFT panel for large-sized LCDs. Accordingly, the inventors proceeded to test the suitability of Nb film.

First, a glass plate having a size of 150 mm² and a thickness of 0.2 mm was introduced into the cluster-type DC magnetron sputtering apparatus shown in FIG. 6 as the glass substrate 1, and a film was deposited while varying the film forming conditions with Nb as the target. Thereafter, a specimen was taken out of the apparatus, and the resistivity and the film stress of the Nb film were measured.

Figure 1:
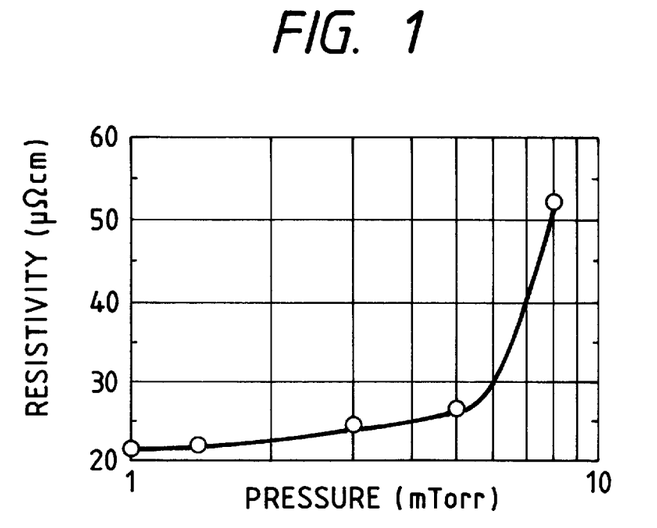
FIG. 1 is a diagram showing experimental data showing the relationship between the resistivity of a Nb film on a glass substrate and the introduced gas pressure.
Figure 2:
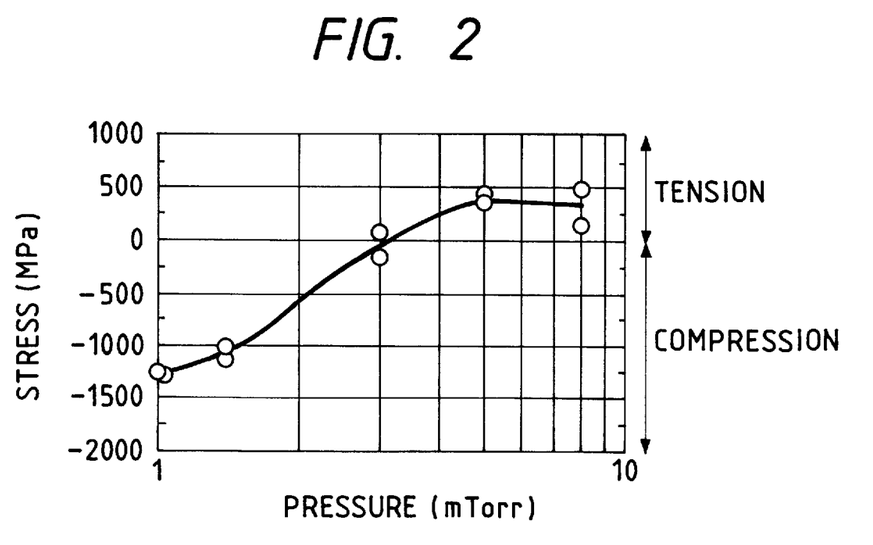
FIG. 2 is a diagram showing experimental data showing the relationship between the residual stress of a Nb film and the introduced gas pressure.

The resistivity was obtained by measuring first the sheet resistance of the film by a four-points probe method and then measuring it using the film thickness obtained from a height of a step formed by selective etching of a part of the film. The film stress was calculated by measuring the difference in deflection before and after film deposition of the glass substrate 1. The obtained results are shown in FIG. 1 and FIG. 2. In particular, these diagrams show the data of the Nb film deposited under the conditions of the substrate temperature of 90° C. (actually measured value immediately before start of sputtering), the residual gas pressure at 1×10⁻⁶ Torr or less and the power density of 6.5 W/cm². It is understood from the diagrams that the resistivity of the Nb film increases as the pressure of the introduced inert gas is increased, and is increases rapidly at 5×10⁻³ Torr or higher. The film stress is increased gradually along with the increase of the introduced gas pressure and saturated. At this time, the direction of the stress changes from compression to tension. As a result, the stress becomes zero when the pressure reaches approximately 3×10⁻³ Torr. Although it is not shown in these diagrams, it has been ascertained that, when the substrate temperature is increased with the introduced gas pressure set at 3×10⁻³ Torr (constant), the stress does not change so much, but the resistivity falls also, when the power density is lowered, the resistivity and the film stress are increased. Accordingly, it is possible to attain the demand for 400 MPa or less of the film stress described in the above-mentioned embodiment almost within the examined whole introduced gas pressure range by controlling the power density to 6.5 W/cm² or higher. However, the resistivity is increased rapidly when the pressure is increased to 5×10⁻³ Torr or higher, which therefore is not desirable. Furthermore, when the pressure is lowered to approximately 2×10⁻³ Torr or lower, the compression stress is increased. In this case, the direction of bending of the substrate is reversed to that in the case of tension described in the above-mentioned embodiment. Namely, the central part of the substrate shows a convex shape upwards. It has been ascertained that this case is not desirable because, although circumstances are slightly different from the case of tensile stress when the circumferential part of the substrate is bent, a tendency develops such that the film becomes liable to peel off when a pressure of approximately 400 MPa or higher is reached.

The substrate temperature realizes the target when it is the room temperature or higher. It has been determined that, when the residual gas pressure increases, the stress scarcely changes, but the resistivity is increased. Thus, the desirable residual gas pressure was found to be 1×10⁻⁶ Torr or lower.

As shown in FIG. 1 and FIG. 2, it is seen that it does not coincide with the object of decreasing the resistivity to reduce the value of the film stress in Nb when attention is paid to the specific character of the film stress. It is possible to control the resistivity to the increase within 20% of the minimum value thereof and moreover to make the film stress almost zero by setting the introduced gas pressure to approximately $3 \times 10^{-3}$ Torr.

Furthermore, a TFT panel for a large-sized LCD was formed on the glass substrate 1 which is 370×470 mm² in size and 0.7 mm in thickness. As explained previously with reference to FIG. 5, four sheets of TFT panels in 10 inches can be produced from one sheet of this glass substrate.

The glass substrate 1 dried after thorough cleaning is housed in the cassette 11 and introduced into the cluster-type DC magnetron sputtering apparatus shown in FIG. 6, and a Nb film is deposited on the substrate heated to 90° C. using a Nb target. Typical film forming conditions at this time are such that the residual gas pressure is $1 \times 10^{-6}$ Torr or lower, the introduced inert gas pressure is $3 \times 10^{-3}$ Torr, and the power density is 6.5 W/cm². The film thickness of Nb was set to 200 nm. The sheet resistance of the obtained Nb film was 1.2 Ω/□.

Figure 3:
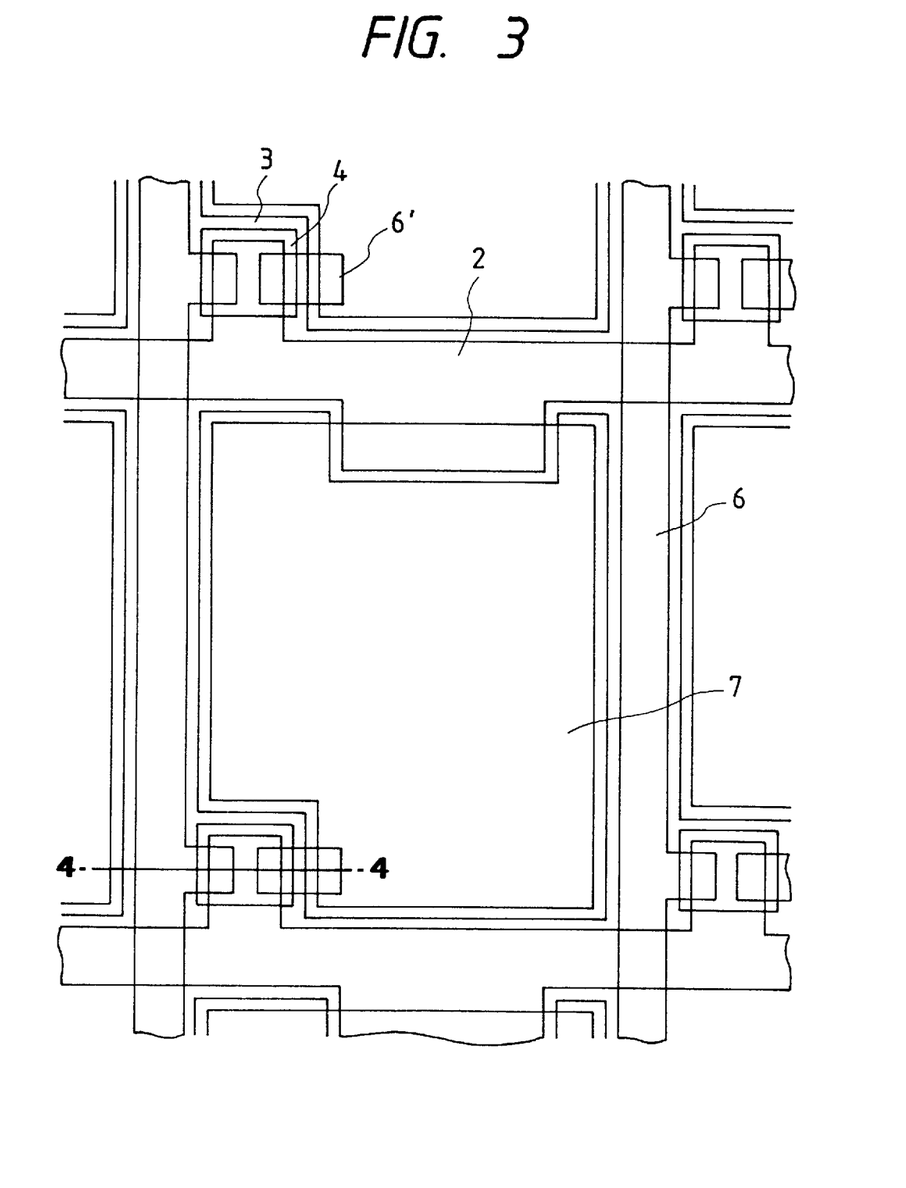
FIG. 3 is a typical plan view of a part of a TFT panel for an LCD.
Figure 4:
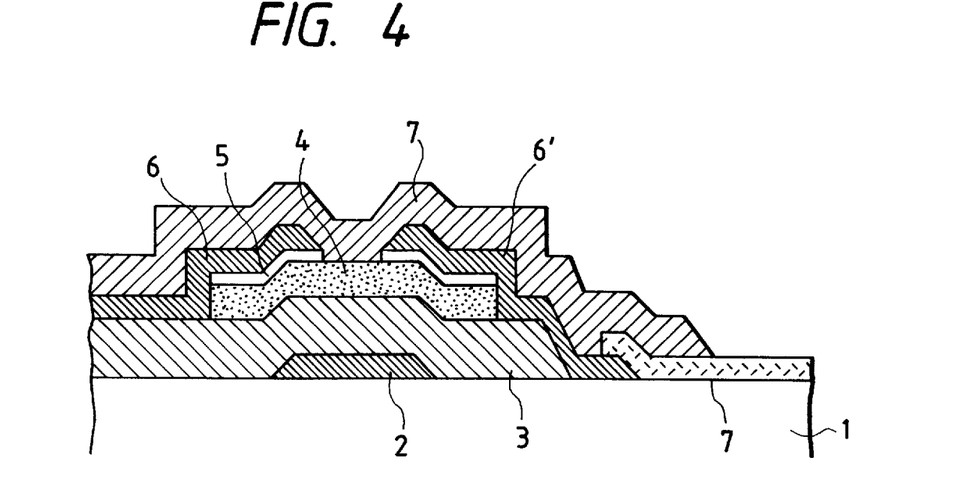
FIG. 4 is a view showing a structure of a section taken along a line A–A' in FIG. 3.

After sputtering, patterning of the Nb film was performed using a photolithography technique. A pattern plan view of one pixel of the TFT panel is shown in FIG. 3. In a color display commonly referred to as a Video Graphics Array (VGA) used frequently in personal computers, 480 lines of gate electrode lines 2 are formed one behind another and 640×3 (red, green and blue) lines of drain electrode lines 6 are formed side by side. A section taken along a line A–A' in FIG. 3 after forming a TFT is shown in FIG. 4.

First, an electrode line 2 was formed by means of application of a photoresist film and dry etching with mixed gas of $CF_4$ and $O^2$. At this time, it is possible to adjust the angle of the taper area formed at the end portion of the gate electrode line 2 by adjusting the mixing ratio of $CF_4$ and $O^2$. In the present embodiment, the taper angle at the end portion of the Nb gate electrode line 2 was set to approximately 45°. By forming such an angle, it is possible to obtain good coverage of a film stacked thereon. The taper angle of the gate electrode line 2 and the coverage property of an insulating film SiN formed thereon were investigated by preliminary examination. To be specific, the taper angle was adjusted within the range of 30 to 80 degrees, a SiN film and then a Nb film were formed thereon respectively by a method which will be described later so as to produce an MIM element, and the dielectric strength of the SiN film was determined. As a result, it was determined that a tendency that a number of elements will have low dielectric strength is increased when the taper angle exceeds 60 degrees.

Next, the glass substrate 1 processed up to the gate electrode line 2 was installed in an RF plasma CVD apparatus (not illustrated), and a SiN layer for forming a gate insulating film 3 was deposited. The substrate temperature was set to 280° C., mixed gas of $SiH_4$, $NH_3$ and $N_2$ was used as the raw material gas, and the SiN layer was deposited in a film thickness of 300 nm. Then, an a-Si:H film 4 of a semiconductor layer was formed in another chamber in the same RF plasma CVD apparatus. The substrate temperature was set to 250° C., and the film 4 was formed using monosilane $SiH_4$ as raw material gas. The film thickness was set to 220 nm. In succession, it was moved to a chamber in the same apparatus, and an $n^+$·a-Si layer 5 doped with P was formed thereon. The substrate temperature was set to 230° C., mixed gas of $SiH_4$, $PH_3$ and $H_2$ was used as the raw material, and the film was formed in a film thickness of 50 nm.

Next, a resist film applied with patterning by photolithography was applied, and the $n^+$·a-Si layer 5 and the semiconductor layer a-Si:H film 4 were applied with patterning in a TFT shape by a dry etching method. In succession, the gate insulating film 3 was processed by photolithography patterning and dry etching following thereon, similarly to the above, and a transparent pixel electrode 7 and a through-hole for a gate electrode terminal take-out portion were formed. A Nb film was deposited thereon with the same Nb target, apparatus and conditions as those used for the gate electrode line 2. This Nb film was processed into source and drain wirings 6 and 6' by photolithography and dry etching following thereon similarly to the gate electrode line 2. In succession, the central part of the $n^+$·a-Si layer 5 was removed by photolithography and dry etching so as to form a channel of the TFT. In this dry etching operation, taking margin for pattern delineation into consideration, not only the $n^+$·a-Si layer 5 (50 nm) (not illustrated) but also the semiconductor layer a-Si:H film 4 are overetched by approximately 100 nm.

Next, after an ITO film of the transparent electrode was deposited at the substrate temperature of 200° C. using a magnetron sputtering method, patterning was applied to the transparent pixel electrode 7 as shown in FIG. 4 by photolithography and chemical etching. In addition, although it is not illustrated, end portions of the gate electrode line 2 and source and drain electrodes 6 and 6' around the panel are also covered with the ITO transparent electrode in the patterning at the same time. The reason is for securing reliability of the connection between the panel and the drive circuit. A SiN film of a protective insulating film 8 was formed thereon by an RF plasma CVD method (omitted in FIG. 3). At this time, the substrate temperature was set to 250° C., mixed gas of $SiH_4$, $NH_3$ and $N_2$ was used as raw material gas, and the film was formed in a film thickness of 300 nm. Thereafter, the protective insulating film 8 around the panel was removed by combining photolithography and dry etching so as to expose the electrode terminal, and a through-hole was also formed at the transparent pixel electrode 7 portion.

In the process to the point described above, no problems in the manufacturing process, including substrate cracking and film peeling, have been generated at all. A part of the produced TFT panel was put into a liquid crystal process, thereby to complete the LCD. It has been confirmed as the result of investigating the display state of the LCD that pixel defects have also not been generated.

The TFT panel production process described above is restated consecutively as follows:
Substrate cleaning
  Deposition of Nb films
    coating of photoresist, exposure, development pattern formation (dry etching): gate electrode stripping of photoresist
  CVD ($n^+$·a-Si/a-Si:H/SiN)
    coating of photoresist, exposure, development pattern formation (dry etching):$n^+$·a-Si/a-Si:H (TFT) stripping of photoresist coating of photoresist, exposure, development pattern formation (dry etching): formation of gate insulating film SiN through-hole stripping of photoresist
  Deposition of Nb films
    coating of photoresist, exposure, development pattern formation (dry etching): source/drain electrode pattern formation (dry etching): removal of $n^+$·a-Si (channel formation) stripping of photoresist
  Deposition of ITO films coating of photoresist, exposure, development pattern formation (dry etching): pixel electrode
stripping of photoresist
CVD (SiN)
coating of photoresist, exposure, development pattern formation (dry etching): formation of through-holes at electrode terminal and pixel electrode portion stripping of photoresist Since the n$^+$·a-Si/a-Si:H/SiN stacked layer by CVD is deposited continuously by one set of apparatus, the number of process is one. Accordingly, the present process is composed of five times of film deposition processes and six times of photolithography processes. However, the present process is featured by that, being different from the past, the Nb material is used for the gate electrode line and the source/drain electrode line and film deposition and processing can be performed in exactly the same process with respect to both electrode lines. Since the throughput can be improved and equipment investment amount and equipment maintenance cost can also be reduced by a large margin with the foregoing, cost reduction of LCD products becomes possible.

As an addition, a production process in which one process each was omitted in the film deposition process and the photolithography process, respectively, was examined for the purpose of further reducing the cost of LCD. Namely, the drain electrode 6 and the source electrode 6' shown in FIG. 3 and FIG. 4 are formed of the transparent pixel electrode 7. A substrate complete up to the CVD process in the embodiment described previously was used, and then an ITO film was deposited by a magnetron sputtering method. At this time, the substrate temperature was set to 230° C. and the film thickness was set to 280 nm (140 nm in the above-mentioned embodiment) in order to lower the film resistance. With this, the sheet resistance of the ITO film was 7 Ω/□. Thereafter, a pattern which is a drain electrode line, a source/drain electrode, and a transparent pixel electrode, all in one, was produced by photolithography and chemical etching. The processes thereafter are exactly the same as those in the above-mentioned embodiment. As the result of examining such a production process, it was found that problems, including substrate cracking and film peeling have not been generated, similarly to the process described previously. Thus, it has been confirmed that a satisfactory result is also produced when the Nb film optimized according to the present invention is applied to at least one of the gate electrode line and the drain electrode line of the TFT panel.

An LCD unit was formed using a part of the TFT panel produced by the process described previously. In this case, however, the Nb film thickness having the resistivity of 25 μΩcm was set to 360 nm, and the sheet resistance was set to 0.7 Ω/□. The sectional view of the formed LCD unit is shown in FIG. 8.

Figure 8:
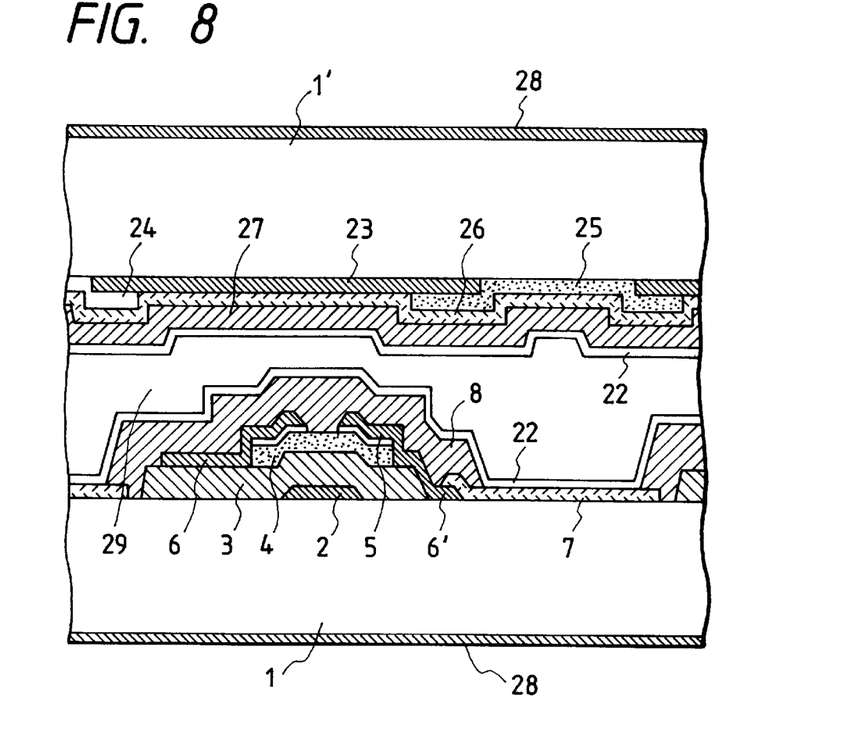
FIG. 8 is a typical sectional view showing a structure of a principal part of LCD.

FIG. 8 shows an LCD unit in which a glass substrate 1 on which a TFT panel is formed and a glass substrate 1' on which a color filter is formed are made to oppose to each other, and a liquid crystal layer 29 is inserted in a gap therebetween.

An alignment film 22 is applied and baked on a protective film 8 and a transparent pixel electrode 7 on the TFT panel, and the surface is applied a rubbing treatment at the same time. A light shield black matrix 23 is formed on the glass substrate 1' on which a color filter is formed. There are three types of black matrixes, one composed of black resin, one composed of metal Cr, and one composed of a stacked layer of metal Cr and chromium oxide, but all of them are produced by photolithography. A color filter is formed thereon. In FIG. 8, only the portions of a blue color filter 24 and a green color filter 25 are shown. The color filter is classified into four types, i.e., dye, pigment dispersion, print and electrodeposition, depending on the forming means. The color filter is produced by photolithography in every case, similarly to the black matrix. A transparent electrode ITO layer 26 is stacked as a common electrode on the color filter. Further, a protective film 27 and an alignment film 22 similar to the TFT panel are formed thereon.

Before two sheets of glass substrates 1 and 1' which are to be stuck together, a spacer (not illustrated) is applied uniformly onto the substrate surface in order to make the distance (cell gap) between both substrates fixed. Thereafter, both substrates 1 and 1' are stuck together with alignment. At this time, the circumferences thereof are joined using epoxy heat-sensitive resin. Then, the liquid crystal layer 29 is injected into the cell after the substrate is cut. The inlet is sealed with epoxy resin. The foregoing shows the outline of the liquid crystal process. Thereafter, the gate electrode line 2, the drain electrode line 6, the common electrode and the drive circuit around the glass substrate 1 are connected using an anisotropic conducting film or the like, and a polarizer 28 is also fitted to the cell surface. Further, it is possible to complete an LCD unit by installing a backlight unit (not illustrated) on the back of the TFT panel.

Furthermore, a structure of a wiring film used in at least one type of the gate electrode, the gate wiring, the drain electrode and the drain wiring will be described in detail.

First, a well cleaned glass substrate was prepared, and a Nb—Mo film was deposited thereon at the substrate temperature of 100° C. using a DC magnetron sputtering method.

Nb of 99.9% purity was in this process, for the target used. A Mo chip (a small piece) was placed on the target, and the addition quantity was controlled depending on the ratio of surface areas of Nb and Mo at this time.

The Mo quantity in the film was confirmed by an Induced Coupled Plasma Spectroscopy (ICP) method.

Approximately 120 nm was aimed at for the film thickness, but differences in level were formed by etching after film deposition, and the height thereof was measured with a stylus type surface roughness tester, thereby to determine the film thickness accurately.

Figure 11:
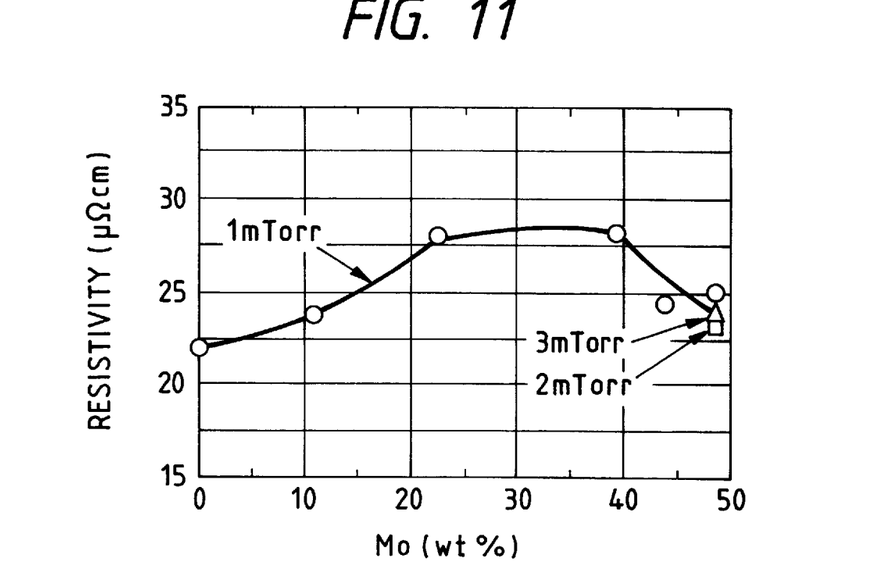
FIG. 11 is a characteristic diagram for explaining the resistivity of a wiring material according to the present invention.

Next, the resistivity was obtained from the film thickness and the sheet resistance obtained by a four-points probe method, and the obtained results are as shown in FIG. 11.

It is understood from FIG. 11 that, when the sputtering gas pressure is 1 mTorr, the resistivity is increased once as the addition quantity of Mo is increased, but it starts to fall thereafter when approximately 40 wt % is exceeded.

At this time, when the sputtering gas pressure is increased to 2 mTorr, and then to 3 mTorr, a tendency that the resistivity is slightly lowered is developed.

Next, a thin glass plate having a thickness of approximately 0.2 mm was used as the glass substrate 1, and the stress generated in the deposited film was evaluated by measuring the difference in deflection of the substrate between those before and after film deposition.

Figure 12:
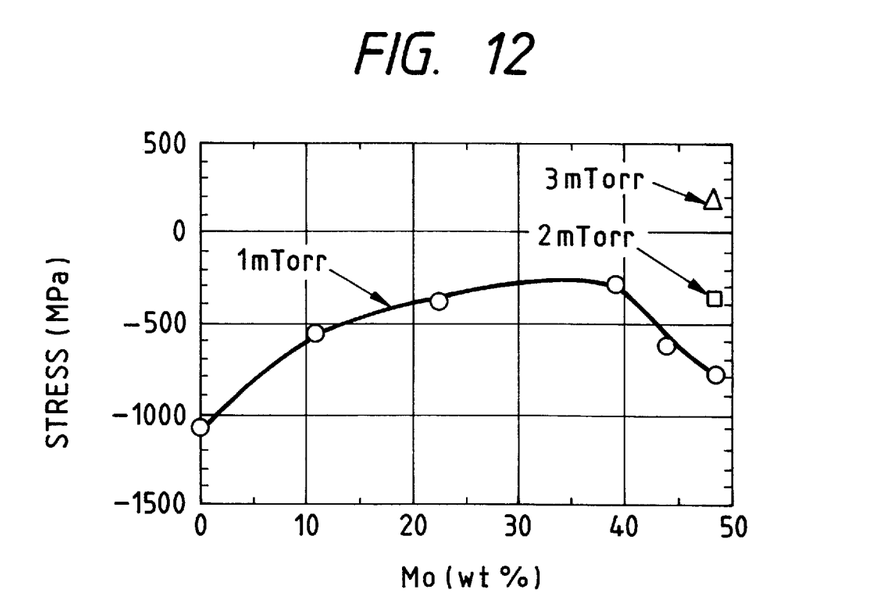
FIG. 12 is a characteristic diagram for explaining internal stress of a wiring material according to the present invention.

The result of evaluation is shown in FIG. 12. In the stress along the axis of ordinates, a positive sign represents the tensile stress and shows that the film face becomes concave and a negative sign represents the compression stress and shows that the film face becomes convex.

It is understood from FIG. 12 that large compression stress of approximately 1,000 MPa occurs when Mo is not added. Further, it is also seen that, as the addition quantity of Mo is increased, the compression stress drops and approaches to zero. Thereafter, the compression stress is increased again at 40 wt % or more.

Further, it has been ascertained that the compression stress can be decreased by increasing the sputtering gas pressure even when the addition quantity of Mo is 40 wt % or more, and weak tensile stress operates on the contrary when the sputtering gas pressure is 3 mTorr.

Thus, it is understood from FIG. 11 and FIG. 12 that, in the present embodiment, a film having low resistivity and small stress is obtainable when the addition quantity of Mo is set to approximately 50 wt % and the sputtering gas pressure is set at 2 to 3 mTorr.

On the other hand, similar effects have been obtained even when V is added, and similar operational effects to those obtained with Mo can be expected.

Besides, such a fact can also be conjectured easily from the comparison in the state diagram of Mo and V.

Now, being premised on the above description, another embodiment of an active matrix type liquid crystal display unit according to the present invention will be described in detail hereinafter.

Figure 9:
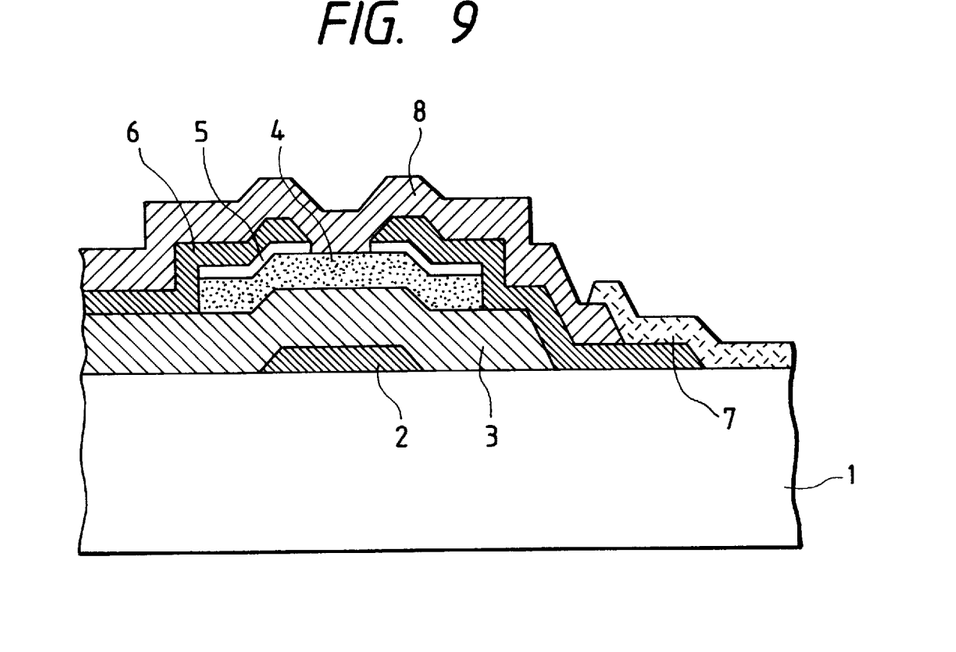
FIG. 9 is a typical sectional view showing a TFT portion in another embodiment of an active matrix type liquid crystal display unit according to the present invention.

The typical plan view of the active matrix type liquid crystal display unit according to the present embodiment is similar to the structure shown in FIG. 3. FIG. 9 shows a typical sectional view of one piece of TFT element in accordance with the embodiment. In these drawings, a reference numeral 1 represents a glass substrate, 2 a gate electrode, 3 a gate insulating film, 4 a semiconductor layer composed of an a-Si:H film, 5 an $n^+ \cdot$a-Si film, 6 a source/drain electrode, 7 a pixel electrode and 8 a protective insulating film.

As it is apparent from FIG. 3, a plurality of TFT elements shown in FIG. 9 are formed on the glass substrate 1 and form a pixel of a liquid crystal display unit, but these elements have been formed as described hereunder.

A Nb—Mo film was deposited on a well cleaned glass substrate 1 at the substrate temperature of 100° C. using a magnetron sputtering method.

At this time, the Mo composition of the target was set to 50.0%, the sputtering gas pressure was set to 2.5 mTorr, and the film thickness was set to 240 nm. The sheet resistance of the film thus obtained was 0.96Ω/□.

This Nb—Mo film was processed into the gate electrode 2 by photoetching.

In this processing, a solution in which hydrofluoric acid of an appropriate quantity was added to the mixed aqueous solution of phosphoric acid, acetic acid and nitric acid was used as the etchant and etching was performed at 40° C. It is possible to control the taper angle at the electrode end portion by adjusting the addition quantity of nitric acid.

In the present embodiment, the taper angle at the end portion of the Nb—Mo gate electrode 2 was set to approximately 30°, and as a result, it was possible to obtain good coverage of a film stacked thereon.

Besides, the taper angle of the gate electrode and the coverage property of the insulating layer SiN formed thereon were examined by preliminary examination. To be specific, the taper angle was adjusted within the range of 10° to 80°, a SiN film and then an Al film are formed thereon, respectively, by a method described later so as to form an MIM element, and the dielectric strength of the SiN film was obtained. As a result, it was discovered that a tendency that the number of elements having low dielectric strength was increased when the taper angle exceeds 60°.

Next, the produced substrate was installed in the RF plasma CVD unit, and a SiN layer which becomes the gate insulating film 3 was formed. At this time, the substrate temperature was set to 280° C., mixed gas of monosilane $SiH_4$, $NH_3$ and $N_2$ was used as raw material gas, and the layer was produced into a film thickness of 300 nm. Then, the a-Si:H film 4 of the semiconductor layer was formed in another chamber within the same RF plasma CVD unit. The substrate temperature was set to 250° C., $SiH_4$ was used as raw material gas, and the film thickness was set to 220 nm.

The semiconductor layer was moved to another chamber in succession, and the $n^+ \cdot$a-Si layer 5 doped with phosphorus (P) was formed thereon. The substrate temperature was set to 230° C., mixed gas of $SiH_4$, $PH_3$ and $H_2$ was used as raw material gas, and the layer 5 was produced in a film thickness of 50 nm.

Next, the $n^+ \cdot$a-Si layer 5 and the semiconductor layer a-Si:H film 4 were applied with patterning into a TFT configuration by a dry etching method.

Then, the gate insulating film was processed similarly to the above by a dry etching method, and through-holes for pixel electrode and gate electrode terminal output portions were formed.

A Nb—Mo film was deposited thereon with the same material and apparatus used for the gate electrode. Namely, the substrate temperature was set to 100° C., the sputtering gas pressure was set to 2.5 mTorr, and the Nb—Mo film was deposited in a film thickness of 240 nm by a DC magnetron sputtering method.

This Nb—Mo film was processed into the source/drain electrode 6 by a dry etching method in which mixed gas of $CF_4$ and $O^2$ was used as the etching gas.

In succession, the a-Si layer 5 was removed so as to form a channel of the TFT by a dry etching method.

Besides, practically, although it is not illustrated, not only the $n^+ \cdot$a-Si layer 5, but also the semiconductor layer a-Si:H film 4 are overetched by approximately 100 nm taking the margin for pattern delineation (for preventing etching remainder) into consideration in the dry etching method of the $n^+ \cdot$a-Si layer 5.

A SiN film that becomes the protective insulating film 8 was formed thereon in a film thickness of 300 nm at the substrate temperature of 230° C. using mixed gas of $SiN_4$, $NH_3$ and $N_2$ as the raw material gas by an RF plasma CVD method.

Thereafter, the protective insulating film SiN around the panel was removed so as to expose the electrode terminal, and a through-hole was also formed at the pixel electrode portion by a dry etching method.

Besides, since illustration becomes complicated, the protective insulating film 8 is omitted in FIG. 3.

Next, after an ITO film which becomes a transparent electrode was deposited at the substrate temperature of 200° C. using a DC magnetron sputtering method, the pixel electrode 7 was patterned by photoetching.

Besides, although it is not illustrated, the end portions of the gate electrode 2 and the source/drain electrode 6 around the panel are covered at the same time with the ITO transparent electrode in the patterning mentioned above, but the reason thereof is to secure reliability of connection between the panel and the drive circuit.

According to the present embodiment, problems that have heretofore occurred such as substrate cracking and film peeling have not been generated at all in the process up to the point described above.

Thus, as the result of putting the TFT substrate thus produced in the liquid crystal manufacturing process in succession, completing the LCD panel, providing the drive circuit, and examining the display state with a backlight, it has been confirmed that the degree of lowering of the yield due to pixel defects is very small.

The TFT manufacturing process according to the above-mentioned embodiment is put in order as follows.

Substrate cleaning

Deposition of Nb—Mo films coating of photoresist, exposure, development pattern formation (also possible by wet etching and dry etching): gate electrode stripping of photoresist CVD (n$^+$·a-Si/a-Si:H/SiN)

coating of photoresist, exposure, development pattern formation (dry etching):n$^+$·a-Si/a-Si:H (TFT) stripping of photoresist coating of photoresist, exposure, development pattern formation (dry etching): formation of gate insulating film SiN through-hole stripping of photoresist Deposition of Nb—Mo films coating of photoresist, exposure, development pattern formation (also possible by dry etching and wet etching): source/drain electrode pattern formation (dry etching): removal of n$^+$·a-Si (channel formation) stripping of photoresist CVD (SiN)

coating of photoresist, exposure, development pattern formation (dry etching): formation of through-holes at electrode terminal and pixel electrode portions stripping of photoresist Deposition of ITO films coating of photoresist, exposure, development pattern formation (wet etching): pixel electrode stripping of photoresist As it is apparent from the foregoing, since the n$^+$·a-Si/a-Si:H/SiN stacked film by CVD is deposited continuously with one set of apparatus, the number of process is one.

Accordingly, the process in the present embodiment is composed of five times of film deposition processes and six times of photolithography processes, which is the same as the prior art.

However, the process of the present embodiment is featured by that, being different from the prior art, the Nb—Mo material is used for the gate electrode and the source/drain electrode, and that film deposition and processing can be performed in exactly the same process with respect to both electrodes.

Thus, since it is possible to improve the throughput and also to reduce equipment investment and maintenance cost by a large margin according to the present embodiment, sufficient cost reduction of LCD products can be attained.

Figure 10:
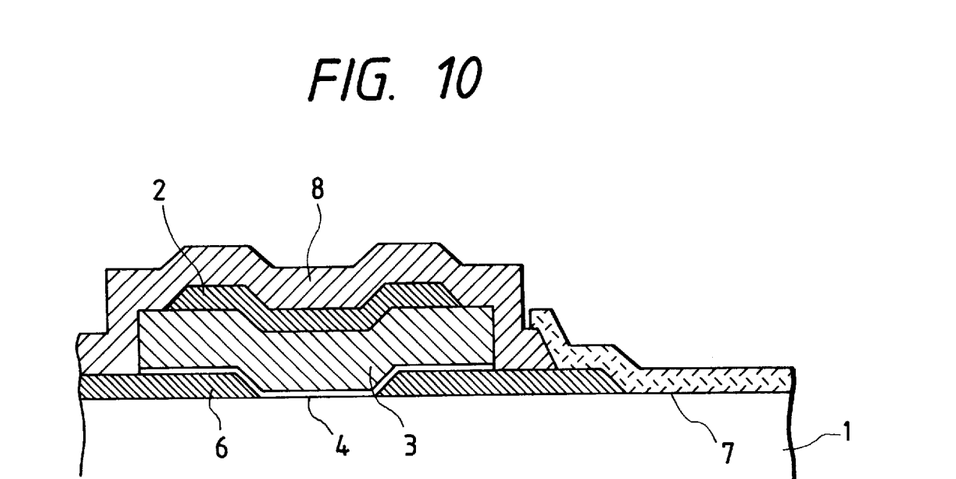
FIG. 10 is a typical sectional view showing a TFT portion in still another embodiment of an active matrix type liquid crystal display unit according to the present invention.

Furthermore, a typical sectional view of a TFT element manufactured according to still another embodiment of the present invention is shown in FIG. 10.

In the present embodiment, a Nb—Mo film was deposited at the substrate temperature of 100° C. on a well cleaned glass substrate 1 using the magnetron sputtering method of the gate electrode in the embodiment 1. The film thickness was set to 120 nm.

This Nb—Mo film was processed into the source/drain electrode 6 by photoetching. This processing method (wet etching) was made exactly the same as that dicussed above for the embodiment 1.

Next, the manufactured substrate was placed in the RF plasma CVD unit, PH$_3$ plasma processing was applied first in order to achieve electrical contact with the source/drain electrode, and an a-Si:H film which becomes the semiconductor layer 4 was formed thereafter. At this time, the substrate temperature was set to 250° C., monosilane SiH$_4$ was used as raw material gas, and the film thickness was set to 18 nm. Besides, the reason why the film thickness is made thinner as described above is to control a photocurrent that flows in the semiconductor layer when the panel is completed which causes an increase in the off current of the transistor.

In succession, a SiN layer which becomes the gate insulating film 3 was formed thereon in the same chamber. The substrate temperature was set to 250° C., similarly to the case of the semiconductor layer, mixed gas of SiH$_4$, NH$_3$ and N$_2$ was used as raw material gas, and the SiN layer was formed in a film thickness of 300 nm.

Then, a Nb—Mo film which becomes the gate electrode 2 was formed at the substrate temperature of 100° C. in a film thickness of 240 nm by the same method as that used for forming the source/drain electrode 6, i.e., the magnetron sputtering method.

Thereafter, the gate electrode 2 was processed, but what slightly differs from the case of the drain electrode 6 at this time is that the Nb—Mo film is overetched. To be specific, it is sufficient to set the etching time to be moderately long.

In succession, the semiconductor layer and the gate insulating film were patterned by a dry etching method keeping the element intact without stripping photoresist.

As a result of measurement at this point, the backspace quantity by overetching for the active layer of the gate electrode Nb—Mo and the gate insulating film pattern width was approximately 1.5 μm on one side. This backspace quantity is a necessary and sufficient distance for preventing short-circuits between the gate electrode and the source/drain electrode.

A SiN film which becomes the protective insulating film 8 was formed thereon by an RF plasma CVD method. The substrate temperature was set to 250° C., mixed gas of SiH$_4$, NH$_3$ and H$_2$ was used as raw material gas, and the SiN film was formed in a film thickness of 300 nm.

Thereafter, the protective insulating film SiN around the panel was removed by a dry etching method, the electrode terminal was exposed, and a through-hole was formed at the pixel electrode portion at the same time.

Furthermore, after the ITO film of the transparent electrode was deposited at the substrate temperature of 200° C. using a magnetron sputtering method, patterning of the pixel electrode 7 was made by photoetching.

Besides, although it is not illustrated, the end portions of the gate electrode 2 and the source/drain electrode 6 are covered with the ITO transparent electrode at the same time in the patterning described above.

In the present embodiment, those problems that have been heretofore produced in the process described above, such as substrate cracking and film peeling, have not been generated at all.

Thus, as the result of putting the produced TFT substrate in the liquid crystal process, completing the LCD panel and examining the display state, it has been confirmed that lowering of the yield due to pixel defects is very small.

Besides, although it has not been described in the above-mentioned embodiment, it is as described above that the present invention is also applicable even when V is used in place of Mo. In this case, similar operational effects to the case when Mo is used are also obtainable.

As described above, according to the present invention, it is possible to form a high-resolution TFT panel of high display quality with high yield on a large-sized thin glass substrate. Since it is possible to control the film stress by the gate electrode line and the drain electrode line of the TFT deposited on the substrate to be a very low value, neither bending nor film peeling of the glass substrate occur. This makes it possible to make the most of a large-sized film deposition apparatus with high throughput. Further, since all the electrode wirings can be processed with a single material, it is possible to contribute to cost reduction of a TFT panel for large size- and high resolution- LCDs in addition to the effects of the throughput and the yield described above.

What is claimed is:

1. An active matrix type liquid crystal display unit provided with a thin film transistor in each liquid crystal element which becomes a pixel, characterized in that respective electrodes of said thin film transistors and at least one type of wiring for these transistors are comprised of an alloy material containing niobium as the major constituent with at least one of molybdenum or vanadium added thereto, wherein said wirings are comprised of the same alloy material.

2. An active matrix type liquid crystal display unit according to claim 1, wherein said wirings are formed in the same film thickness.

3. An active matrix type liquid crystal display unit according to claim 1, wherein a taper of 60° or less is formed in said wiring at a pattern edge portion thereof.

4. An active matrix type liquid crystal display unit provided with a thin film transistor in each liquid crystal element which becomes a pixel, characterized in that respective electrodes of said thin film transistors and at least one type of wiring for these transistors are comprised of an alloy material containing niobium as the major constituent with at least one of molybdenum or vanadium added thereto, wherein said wiring is formed of a stacked layer of an alloy layer having a high concentration of at least one type of metal of said molybdenum or vanadium and an alloy layer having a low concentration of the same.

5. An active matrix type liquid crystal display unit provided with a thin film transistor in each liquid crystal element which becomes a pixel, characterized in that respective electrodes of said thin film transistors and at least one type of wiring for these transistors are comprised of an alloy material containing niobium as the major constituent with at least one of molybdenum or vanadium added thereto, wherein said wiring is comprised of a stacked layer of a layer of niobium and a layer of said alloy material.

6. A method of manufacturing a liquid crystal display unit for forming:

gate electrode lines and drain electrode lines provided on a transparent insulating substrate, wherein said gate electrode lines and said drain electrode lines intersect each other in a matrix form, with electrical insulation formed at each intersection of the gate electrode lines and drain electrode lines, thin film transistors provided adjacent the intersections of said gate electrode lines and said drain electrode lines, and pixel electrodes provided on said transparent insulating substrate, each of said pixel electrodes being connected to a corresponding thin film transistor of said thin film transistors;

wherein film deposition of said gate electrode lines and said drain electrode lines is performed by DC magnetron sputtering under such conditions that residual gas pressure is $1 \times 10^{-6}$ Torr or less, introduced gas pressure is 2 to $5 \times 10^{-3}$ Torr, and power density is 5 W/cm$^2$ or higher.

7. A method of manufacturing a liquid crystal display unit according to claim 6, wherein film deposition by said DC magnetron sputtering of said gate electrode lines and said drain electrode lines is performed under a condition that the temperature of said transparent insulating substrate is set to be 90° C. or higher.

8. A method of manufacturing a liquid crystal display unit according to claim 6, wherein all of said gate electrode lines and said drain electrode lines are formed of Nb films of the same thickness under the same deposition conditions.

* * * * *